United States Patent [19]
Barnhouse et al.

[11] Patent Number: 5,133,669
[45] Date of Patent: Jul. 28, 1992

[54] CIRCUIT BOARD PINS

[75] Inventors: Robert L. Barnhouse, Royal Palm Beach; H. Scott Estes, Delray Beach, both of Fla.

[73] Assignee: Northern Telecom Limited, Montreal, Canada

[21] Appl. No.: 555,600

[22] Filed: Jul. 23, 1990

[51] Int. Cl.$^5$ .............................................. H01R 13/04
[52] U.S. Cl. ........................................ 439/78; 439/75; 439/924; 29/874
[58] Field of Search ..................... 439/78, 82–84, 439/931, 886, 660, 693, 699, 75, 43–49, 924; 29/874, 878; 174/261

[56] References Cited

U.S. PATENT DOCUMENTS

| | | | |
|---|---|---|---|
| 646,179 | 3/1900 | Ireland | 439/699 |
| 886,811 | 5/1908 | Hagadoon et al. | 439/699 |
| 1,359,280 | 11/1920 | Schwartz | 439/699 |
| 2,755,452 | 7/1956 | Rogie | 439/699 |
| 3,907,393 | 9/1975 | Ludwig | 439/699 |
| 4,687,269 | 8/1987 | Dubertret et al. | 439/82 X |
| 4,726,774 | 2/1988 | Marks | 439/45 |
| 4,859,806 | 8/1989 | Smith | 174/261 |
| 4,897,055 | 1/1990 | Jurista et al. | 439/924 |

OTHER PUBLICATIONS

"Test Socket for Pin Contacts", *IBM Technical Disclosure Bulletin,* vol. 6, No. 5, Oct. 1963, p. 44.
"Ferrite Core Testing Probe", *IBM Technical Disclosure Bulletin,* vol. 1, No. 5, Feb. 1959, p. 20.

*Primary Examiner*—Larry I. Schwartz
*Assistant Examiner*—J. R. Daulton
*Attorney, Agent, or Firm*—Foley & Lardner

[57] ABSTRACT

A printed circuit board pin having a dielectric body and two or more conductor lines extending along the body, the conductor lines insulated from one another. In one construction, the body is planar with a planar conductor line on each of two opposite sides of the pin. This pin may be made by stamping from a laminate sheet of the dielectric material sandwiched between layers of conductor material. Three or more conductors upon a pin may be formed by plating techniques or possibly by extrusion.

5 Claims, 10 Drawing Sheets

CIRCUIT BOARD PINS

BACKGROUND OF THE INVENTION

1. Field of the Invention

This invention relates to improvements in or relating to circuit board pins.

Circuit board pins are conventionally formed by two different methods. In one conventional method, a length of conductor wire is fed through forming stations in which succeeding parts of the length are deformed into the desired pin shape and the shaped pins are subsequently severed in succession from the wire length. In the other conventional method, a strip of conductive metal is passed intermittently through a succession of forming stations in which the strip is stamped to remove material between regions of metal extending laterally of the strip, these regions then being deformed in steps into the desired pin shape. In the finished structure, the ends of the pins are still attached to side edges of the strip and need to be subsequently removed.

2. Description of the Related Art

Any method of producing circuit board pins results in a metal pin which is then inserted into a corresponding hole in a printed circuit board to make electrical contact with a circuit in the board. At the present time, efforts are being made to miniaturize electrical and electronic circuitry and its component parts. While many improvements have been made in this respect, particularly with regard to the sizes of solid state chips for performing multiple electronic functions, efforts to reduce the size of printed circuit boards have been somewhat frustrated because of the sizes of the printed circuit board pins. In any pin design, the pins need to be of particular cross-sectional areas and shapes to produce certain strength requirements for the pin to enable it to be handled and inserted into a hole in the printed circuit board without damage. As a result, the hole size in the printed circuit board and the spacing between adjacent holes is somewhat dictated by the pin size.

The present invention seeks to provide a circuit board pin which may enable a higher concentration of circuitry to be carried by a printed circuit board thereby allowing a reduction in size of the printed circuit board.

SUMMARY OF THE INVENTION

Accordingly, the present invention provides a circuit board pin comprising a dielectric body carrying a plurality of electrical conductor lines which extend longitudinally of the pin and are electrically isolated from one another.

A pin of the invention as defined above may be inserted into a hole in a printed circuit board having a plurality of circuit paths with conductor terminals associated with the hole, one circuit path for each electrical conductor line of the pin. These plurality of conductor terminals at the hole are relatively electrically isolated. These terminals may be provided by conductive layers each extending partly around the surface of the hole, the layers being spaced apart so as to electrically isolate them from one another. Insertion of the pin into the hole with conductor lines of the pin aligned with the conductor terminals within the hole causes each of these conductor terminals to be electrically connected with a respective conductor line on the pin.

With a circuit board pin according to the invention, the conductor lines do not require the same or a comparable cross-sectional area to that required by a conventional pin for strength requirements. The strength requirements of the pin of the invention are mainly or wholly provided by the dielectric body. The conductor lines of a pin according to the invention need only be of sufficient cross-sectional area to suit the electrical requirements of the lines. As a result, a printed circuit board pin according to the invention may, in one example, have a cross-sectional area or lateral dimensions comparable to that of a conventional pin while providing two conductor lines instead of one according to conventional practice. With the provision of at least two conductor lines, more terminals may be provided for a certain size of printed circuit board than is at present possible with the existing art.

Further to this, the use of the inventive pins upon a circuit board having a plurality of conductor terminals at each hole for connection with the circuit lines of respective pins enables the board to be designed with an extremely dense circuitry arrangement with distances between terminals being minimized and dictated by hole size in the board.

The pin construction according to the invention may be of various configurations and designs. For instance, one or more of the conductor lines may be exposed at a surface of the dielectric body or may lie embedded within the body with ends of the conductor lines projecting from the body. When two conductor lines are exposed at the surface of the body, they are spaced from one another around the surface. The body may be of circular cross-section for instance, of rectangular configuration or any other configuration in cross-section to suit its particular requirements.

In one preferred arrangement, a pin has a dielectric body with two planar and remote oppositely facing sides. The body may conveniently be of rectangular or square cross-section. In this arrangement two conductor lines are provided, one line upon each oppositely facing side. The pin may be inserted into a hole in a printed circuit board which has two circuit paths communicating with the hole and electrically connected to two electrically isolated and diametrically opposed conductor terminals within the hole.

The invention also includes a method of making a printed circuit board pin comprising forming an elongate body of dielectric material, the body carrying a plurality of electrical conductor lines which are electrically isolated from one another and extend longitudinally of the body.

The method of the invention may be performed in various ways. In a preferred manner of performing the invention, a strip of the dielectric material is first provided. Desired regions on opposite sides of the strip are then provided with plating of conductive material and a plurality of circuit board pins are stamped from the plated strip. In each stamped pin, the plated conductive material provides two conductor lines on remote oppositely facing sides of the pin, the two lines electrically isolated from one another. To provide the plating in the desired regions, other regions in which conductive material is not required may be masked before the plating procedure. Alternatively, both sides of the strip may be completely plated and the plated conductive material selectively removed, e.g. by machining or by chemical action, from the other regions where it is not desired.

Alternatively, the dielectric body of the pin is preformed and is then selectively masked on its outer surface except for longitudinally extending exposed surface regions where conductor lines are required, and the conductor lines are then formed on the exposed regions by plating procedures.

In a further alternative method, the dielectric body is formed by injection molding with the conductor lines located, prior to the molding process, in specific locations within the mold. In yet another alternative, a plurality of pins are formed by a continuous process by providing indefinite lengths of conductor wire to provide the conductor lines and then passing these lengths along predetermined spaced apart pass lines through an extruder head while a dielectric extrudate material is extruded around them. The continuously formed length of the dielectric carrying the conductor lines is then severed into the individual pins.

The invention further includes a printed circuit board and circuit board pin assembly comprising a plurality of circuit board pins each of which comprises a dielectric body carrying a plurality of electrical conductor lines which are electrically isolated from one another and extend longitudinally of the pin, each pin mounted within a pin receiving hole of the printed circuit board with at least one end of the pin extending from the board, and the board having in each hole, a plurality of circumferentially spaced apart and mutually electrically isolated conductor terminals which extend longitudinally of the hole, the conductor terminals in each hole being electrically connected one to each of the conductor lines on the pin and one to each of a plurality of mutually electrically isolated circuit lines carried by a substrate of the board.

The invention includes in addition, a method of providing an assembly of printed circuit board and a plurality of circuit board pins comprising providing a circuit board pin comprising a dielectric body carrying a plurality of electrical conductor lines which extend longitudinally of the pin and are electrically isolated from one another; providing a printed circuit board formed with a plurality of holes and comprising a plurality of conductor terminals circumferentially spaced apart and mutually electrically isolated within each hole, each terminal electrically connected to an individual circuit line carried by a substrate of the board; and inserting each pin into a respective hole and electrically connecting each conductor line of the pin with a respective conductor terminal within its hole.

Embodiments of the invention will now be described, by way of example, with reference to the accompanying drawings, in which:

DETAILED DESCRIPTION OF THE PREFERRED EMBODIMENTS

Figures 1, 2, 3, 4:
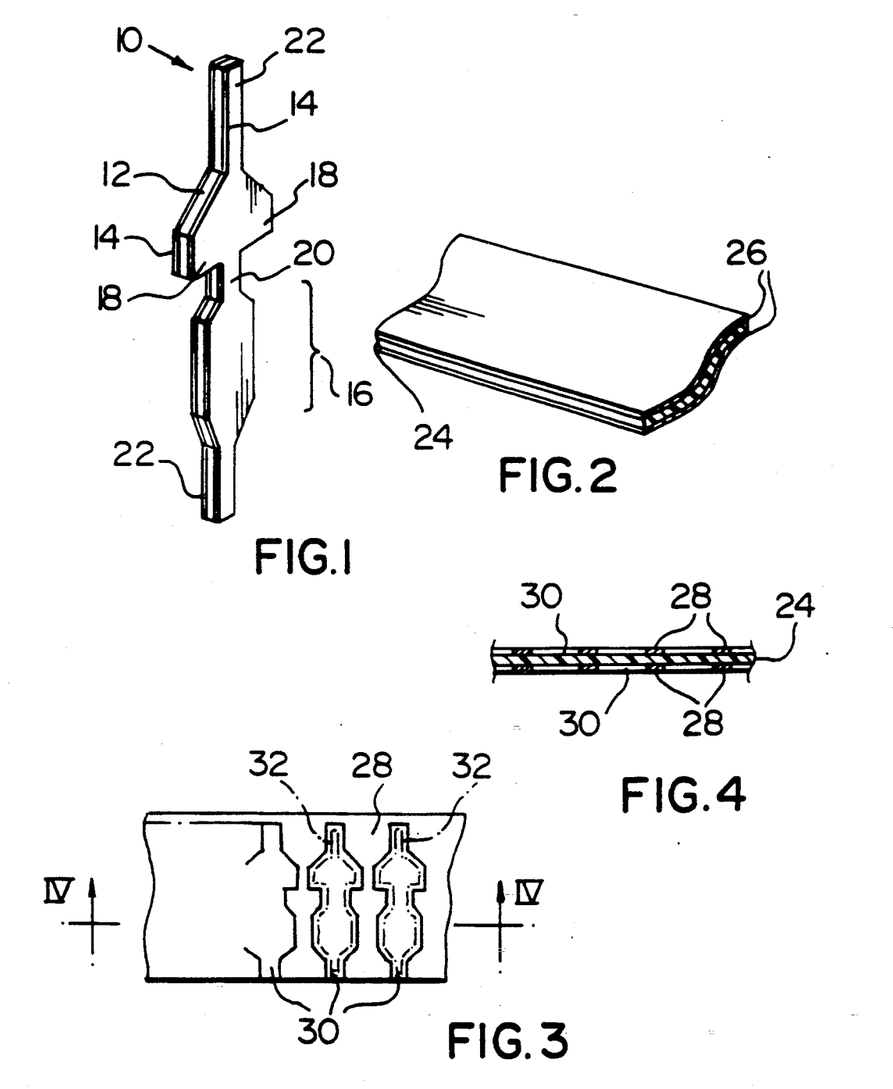
FIG. 1 is an isometric view of a printed circuit board pin according to a first embodiment.
FIG. 2 is an isometric view showing a stage in the manufacture of the pin of the first embodiment and to a smaller scale than FIG. 1.
FIG. 3 is a plan view of a coated plastic strip for making the pin of the first embodiment according to a process different from that shown in FIG. 2.
FIG. 4 is a cross-sectional view through the strip of FIG. 3 and taken along line IV—IV in FIG. 3.

In a first embodiment as shown in FIG. 1, a circuit board pin 10, comprises a planar dielectric body 12 formed from a suitable plastics material, the dielectric body being of constant thickness from one end to the other of the pin. At any section along the pin, the body 12 is of rectangular or square section. Upon remote oppositely facing sides of the body 12 are provided two conductor lines 14 which completely cover the sides and are electrically isolated from one another by the body 12. The pin 10 has a main longitudinally extending section 16 for insertion into a printed circuit board, two oppositely facing abutment shoulders 18 spaced from one end of the section 16 by a neck 20 and two ends 22 of the pin by which the two conductor lines 14 may be soldered or otherwise connected to separate incoming electrical wiring or contact springs.

The pin 10 may be conveniently formed as one of a plurality of identically shaped pins by taking an indefinite length or strip 24 of the dielectric material to form the body (see FIG. 2) and after coating over the whole of both sides of the strip 24 with layers 26 of the conductive material, the individual pins are separated from the coated strip to provide the structure shown in FIG. 1. The pins are separated in known manner for making conventional metal printed circuit board pins from strip by a stamping process.

With the pin 10 described above, the dimension along the major axis across the section 16 may be suitable for insertion into a 0.040 inch diameter hole and is comparable to dimensions of conventional all metallic circuit board pins. While the dimensions are comparable, the pin 10 does provide two completely electrically isolated conductor lines 14. The plastics material of the body provides the required strength for the body for handling and pin insertion purposes while the conductor lines 14 need only have sufficient cross-sectional area for their electrical requirements. The thickness of each of the conductor lines 14 may only be in the region of 0.005 inches. Thus there is a small cross-sectional area of conductor line 14 on each side of the body 12 and, as a result, a minimized resistance to the passage of electrical signals along the conductor lines.

In an alternative method of forming each of the pins 10 (FIGS. 3 and 4), the strip 24 is selectively masked on regions 28 on each side of the strip so as to provide unmasked regions 30 which correspond to the positions of the pins to be stamped and extend slightly outside them as is indicated by the chain-dotted lines 32 for the pins in FIG. 3. The strip is then selectively plated in the unmasked regions 30 on both sides of the strip. The pins 10 are then separated from the strip and again have the structure shown in FIG. 1.

In a modification of the first embodiment, the pins are formed from another dielectric material such as fiberglass or a ceramic.

A plurality of the pins 10 are to be inserted into holes of a printed circuit board, two separate circuit lines of the board extending to two conductor terminals within each of the holes, the two conductor terminals being electrically isolated from one another.

To make the printed circuit board, a conventional fiberglass substrate 34 (see FIG. 6) is provided for carrying the circuitry of the board, the substrate having a preformed layer 36 of copper laminated upon each of its surfaces.

The conductor terminals are made in the following manner.

By electroless plating techniques, a conductive material, namely copper, is added upon the two layers 36 and into each of the holes 38 in the substrate so as to provide a covering layer 40 which may be in the region of 0.0001 to 0.0002 inches thick. As can be seen from FIGS. 5 and 6 this layer covers all the exposed surfaces of the layers 36 and of the surfaces of the holes 38. Subsequently as shown by FIG. 7, a screen 39 is provided over the two outside planar surfaces of the layer 40 as a conventional plating resistive ink screened image mask so that parts 42 of the layer 40 which overlay the layer 36 and which follow desired conductors paths in the finished board remain exposed.

Figures 5, 6, 7, 8, 9:
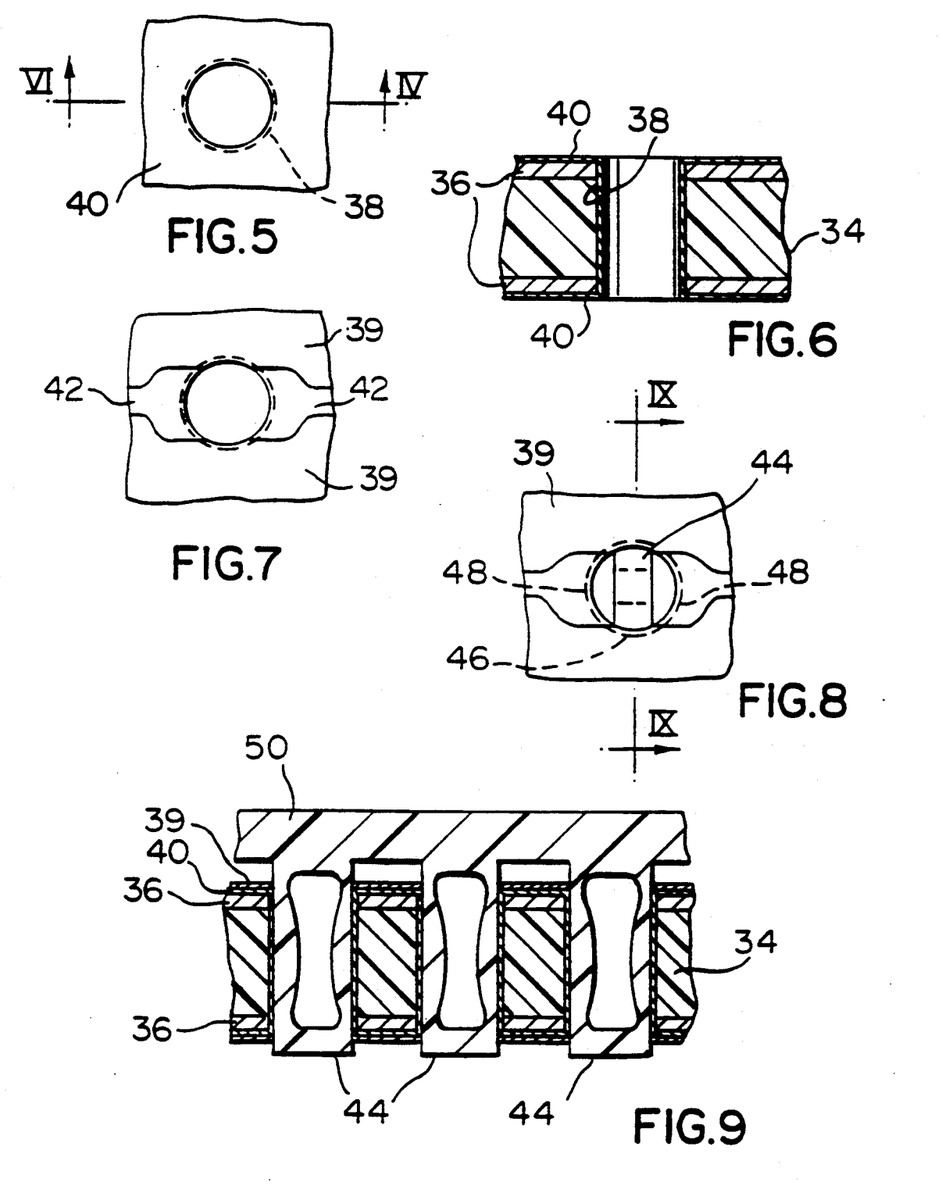
FIG. 5 is a plan view of part of a substrate at a first stage of forming two electrical conductor terminals upon the surface of a hole in the substrate during manufacture of a printed circuit board.
FIG. 6 is a cross-sectional view through the substrate taken along line VI—VI in FIG. 5.
FIGS. 7 and 8 are plan views of the part of the substrate showing two further stages in the formation of the electrical conductor terminals.
FIG. 9 is a cross-sectional view of the partially completed board taken along line IX—IX in FIG. 8 and showing a plurality of adjacent holes.
Figure 10:
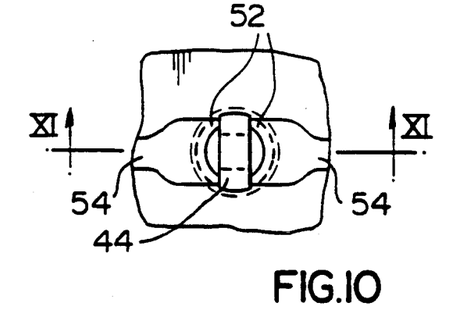
FIG. 10 is a plan view of the part of the substrate showing yet a further stage in the manufacture of the conductor terminals.
Figure 11:
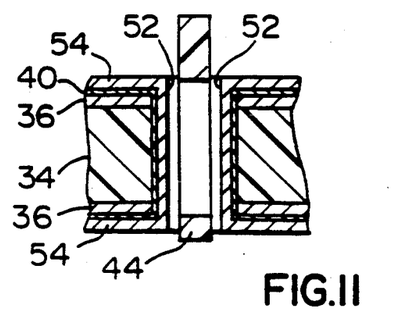
FIG. 11 is a cross-sectional view of the partially completed board taken along line XI—XI in FIG. 10.
Figure 12:
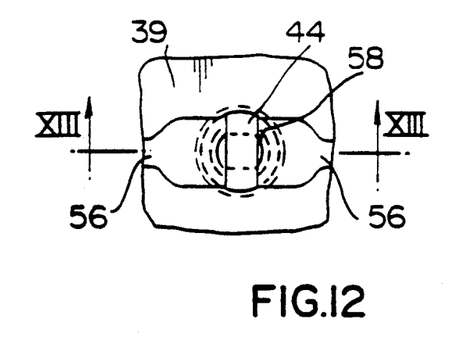
FIG. 12 is another plan view showing a later stage in the manufacture of the conductor terminals.
Figure 13:
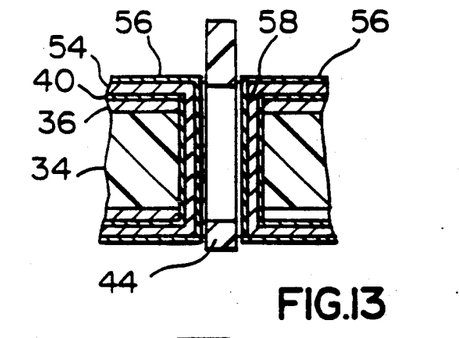
FIG. 13 is a cross-sectional view of the partially completed board taken along line XIII—XIII in FIG. 12.

In the next stage, plugs 44 of resilient elastomer are inserted into each of the holes as shown in FIGS. 8 and 9. The plugs 44 are masking plugs and engage and mask circumferentially extending regions 46 of the layer 40 in each hole so that other circumferentially extending regions 48 of the layer 40 in the holes remain unmasked by the plugs. As may be seen from FIG. 8, the circumferentially extending regions 48 are circumferentially spaced apart around each hole by a plug. As seen by FIG. 9, for convenience during commercial manufacture and with the holes arranged in straight lines, a plurality of the plugs 44 may be molded integrally with a main header 50 so that the plugs for any particular row may be inserted together in a single operation. In a further stage in the manufacture of the two conductor terminals, by electroplating techniques further copper is added to the parts of the layer 40 remaining exposed. This electroplating operation results in a further layer 52 of copper added to each of the circumferentially extending regions 48 within each hole (FIGS. 10 and 11) and a further layer 54 upon the layer 40 upon each surface of the board. An etch masking substance is then provided upon the layers 52 and 54, this etch masking substance being a conventional tin/lead mixture to form an overall covering layer 56 extending over the layers 54 and a layer 58 upon the layer 52 within each of the holes 38. This is the stage shown in FIGS. 12 and 13.

Figure 14:
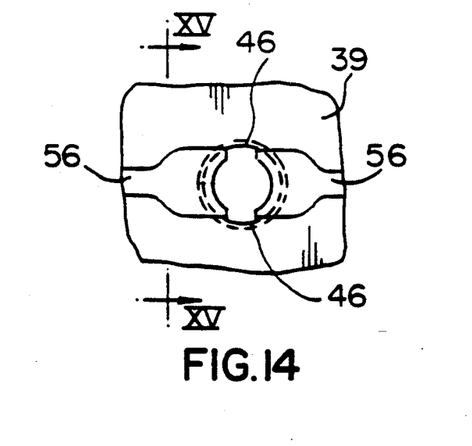
FIG. 14 is yet a further plan view showing the next stage in the manufacture of the conductor terminals.
Figure 15:
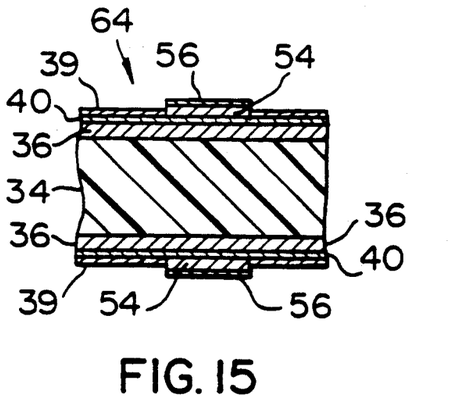
FIG. 15 is a cross-sectional view of the board taken along line XV—XV in FIG. 14.
Figure 16:
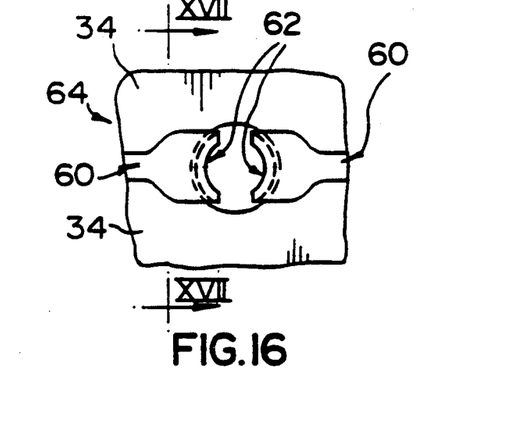
FIG. 16 is a plan view showing the completed conductor terminals.
Figure 17:
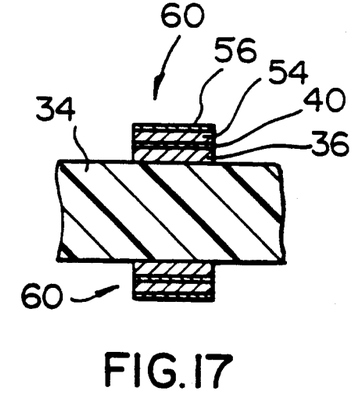
FIG. 17 is a cross-sectional view of the board taken along line XVII—XVII in FIG. 16.

The masking plugs 44 are then removed from the holes 14 as shown by FIG. 14. At this stage, as shown by a cross-section (FIG. 15), the screen 39 overlies the electroless copper layer 40 at each side of each electroplated layer 54. This screen is removed by conventional degreasing techniques to expose the underlying parts of the electroless deposited layer 40. By conventional etching techniques, all of the exposed copper is then removed. This comprises the electroless copper in the circumferentially extending regions 46 (FIG. 14), which were previously masked by the plugs 44 and the layer 40 and the underlying originally provided copper layer 36 on each side of the substrate 34 which were covered by the screen 39. As a result, areas of the conductor material remain on both surfaces of the substrate (FIGS. 16 and 17) these desired areas providing individual circuit lines 60 on each side of the board 10 and which extend to individual electrical conductor terminals 62 provided along the surface of each hole as shown by FIG. 16. Conductor terminals 62 extend circumferentially of each hole in arcuate fashion as shown by FIG. 16 with each conductor terminal composed of all of its layers 40, 52 and 58 to provide the total thickness of each conductor terminal. With each hole thus bearing two separate conductor terminals 62 and individual circuit lines 60 of the completed board circuit, the printed circuit board 64 is thus complete.

The printed circuit board may be provided with the two conductor terminals 62 in the manner described with holes 38 having a diameter of around 0.040 inches.

Figure 18:
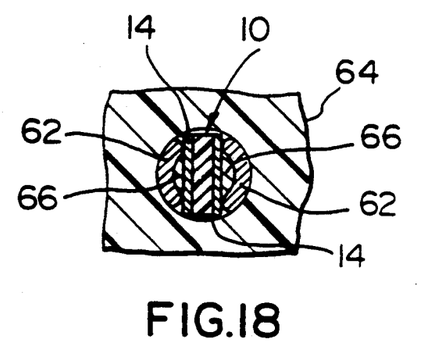
FIG. 18 is a cross-sectional view of part of the circuit board with the pin of the first embodiment inserted into a hole in the board.

A plurality of the pins 10 are inserted, each into an individual hole 38, in the printed circuit board 64. This is shown by FIG. 18 in which, for convenience, each conductor terminal 62 is shown as a single layer. With regard to each hole as shown by FIG. 18, the pin 10 extends diametrically across the hole and each of the conductor lines 14 electrically contacts two axially extending edges of a respective conductor terminal 62. In fact, corners at the edges of the conductor terminals 62 may cut into the conductor lines 14 during assembly so as to provide a gas-tight effective connection. Subsequently, gaps defined between the conductor terminals 62 and the conductor lines 14 are filled with solder 66 so as to secure the pin 10 in position and also to provide an effective and permanent electrical connection between each conductor line 14 and its conductor terminal 62 within the hole. Each conductor line 14 is thus electrically connected with an individual circuit line 60 on each side of the board. The soldering operation may be performed by known soldering techniques, e.g. by the use of vapor phase soldering techniques together with a solder doughnut disposed upon an upper end of the pin and which is caused to flow along the gaps upon melting of the solder. It has been found that with the use of solder, with each electrical conductor terminal 62 connected securely to its conductor line 14, no electrical connection is formed by the solder around the body 12 between one conductor line 14 and the other.

Figure 19:
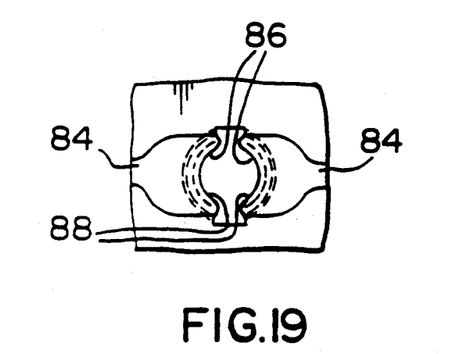
FIG. 19 is a plan view of a printed circuit board with conductor terminals formed in a different manner from those shown in FIG. 16.
Figure 20:
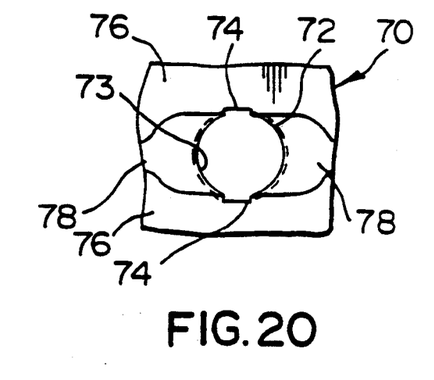
FIGS. 20 and 21 are plan views showing different stages in the formation of the conductor terminals of FIG. 19.
Figure 21:
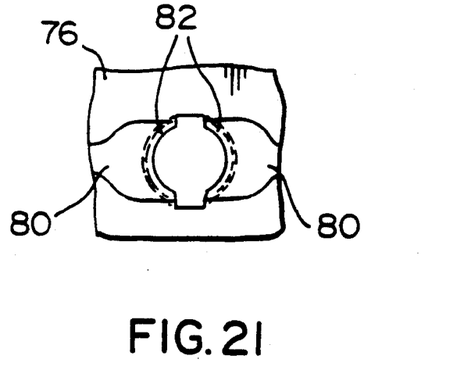
Figure 22:
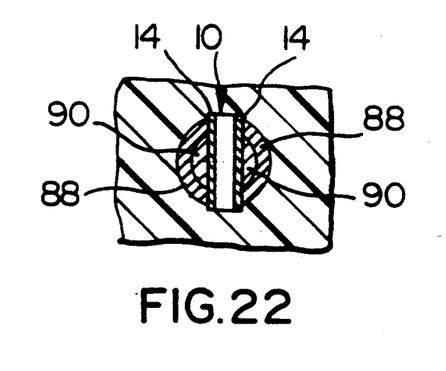
FIG. 22 is a view similar to FIG. 18 and showing the pin of the first embodiment inserted into the board of FIG. 19.

Electrical conductor terminals may be formed in a printed circuit board in a different manner for connection to the conductor lines 14 of the pins 10. For instance, a printed circuit board 68 (FIG. 19) is formed from a substrate 70 (FIG. 20) having upon each side surface a preformed and laminated layer (not shown) of copper similar to the layers 36 described above. After a layer of copper is laid over all surfaces by an electroless process and provides an extra thickness layer 72 of 0.0001 to 0.0002 inches which extends around the inside surface of the hole 73, then diametrically opposed circumferentially extending regions 74 of the layer 72 are removed as shown by FIG. 20. Regions 74 may extend also into the material of the substrate itself but preferably should not do so, because of delamination problems which may result in the fiberglass of the substrate. However, to distinguish in FIGS. 19 to 22 of the drawings, from previous figures, the regions 74 are, indeed, shown as extending into the substrate although in practice that is not advisable. The material at the regions 74 may be removed by milling, routing, broaching or laser cutting techniques. The removed regions 74 are of such a size as to comfortably accept a section 16 of a pin 10 when the pin is pressed into the hole as shown in FIG. 22. The copper on the two surfaces of the board is then covered in regions where copper conductors are not required in the finished board by a screen 76 (similar to screen 39) as shown in FIG. 20 so that copper remains exposed upon each surface in regions 78 where circuit lines are to be provided to each of the holes 73. Subsequently, as shown in FIG. 21, a further conductive layer 80 is applied by electroplating upon the regions 78 and a layer 82 of copper is also applied by electroplating upon the electroless layer 72. A section through the board with the respective layers then resembles that of FIG. 11 with the masking plug 44 in FIG. 11 omitted. A final deposition is then made with an etch masking material, i.e. tin/lead, to provide an overlying layer 84 (FIG. 19) upon the layer 80 and a layer 86 of tin/lead is formed upon the layers 82 within the hole. A section through the board 80 at this stage then resembles FIG. 13 with the masking plug 44 removed. The screen 76 is then removed from each side of the board and the copper material underlying the screen is then removed by conventional etching techniques. This results in circuit lines on the board surfaces underlying and including the layers 84, and arcuate electrical conductor terminals 88 within each hole extending circumferentially around the hole and spaced apart from each other. Each of the conductor terminals 88 is formed from the electroless layer together with the layers 82 and 86 in the manner described above.

A pin 10 is inserted into each hole (FIG. 22) and extends diametrically across it and into the two removed regions 74 with each conductor line 14 electrically abutting edges of a respective conductor terminal 88. In FIG. 22 each conductor terminal 88 is sectioned as a single layer for clarity. Subsequently, gaps formed between the conductor terminals 88 and the conductor lines 14 are filled with solder 90 so as to secure each pin in position and also to provide an effective electrical contact between each conductor line 14 and its respective conductor terminal 88. The soldering operation may be performed by known soldering techniques as explained above.

In further embodiments now to be described, while more than two conductor lines are described within each circuit board pin, the size of each pin and its respective hole in a circuit board may, because of manufacturing restrictions need to be larger than those described in the first embodiment.

Figure 23:
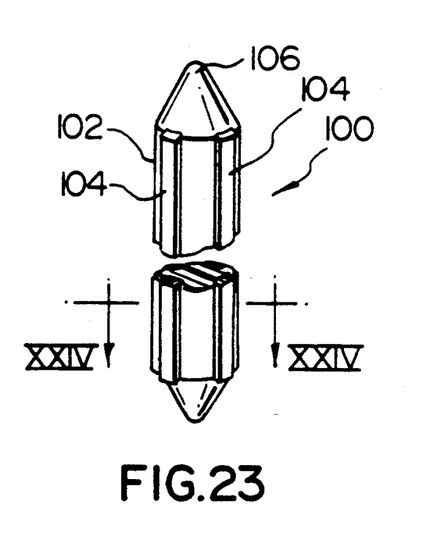
FIG. 23 is an isometric view of a circuit board pin according to a second embodiment.
Figure 24:
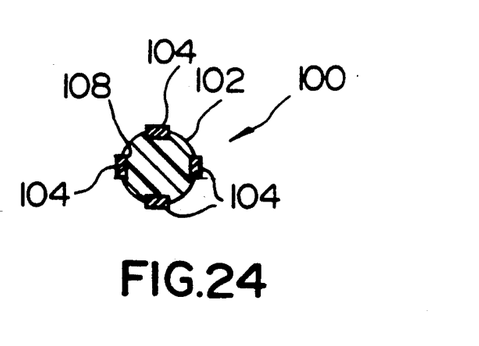
FIG. 24 is a cross-sectional view through the pin of the second embodiment taken along line XXIV—XXIV in FIG. 23.

In a second embodiment, as shown in FIGS. 23 and 24, a printed circuit board pin 100 of definite length comprises a dielectric body 102 which carries four relatively electrically isolated conductor lines 104 extending along the length of the body. The body is molded from a urethane material or from any other suitable dielectric material, and has tapered ends 106. The conductor lines 104 are of substantially rectangular shape, as shown in FIG. 24, and are laterally spaced apart around the substantially circular periphery of the body 102 and lie in recesses 108 of the body so as to protrude slightly from the surface of the body.

Figure 25:
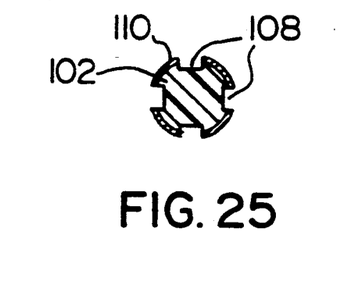
FIGS. 25 and 26 are cross-sectional views through the partially completed pin of the second embodiment at different stages in its manufacture.
Figure 26:
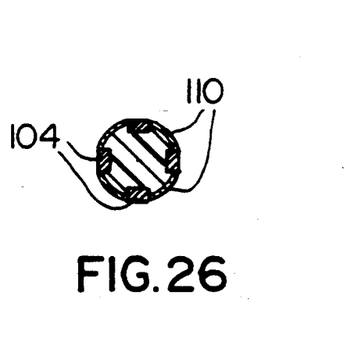

The circuit board pin 100 may be formed by a plating process the stages of which are shown in FIGS. 25 and 26. After the body 102 has been preformed by molding techniques which also provide the longitudinally extending recesses 108, the peripheral surface of the body is masked by a suitable masking material 110 between the recesses 108. This is shown in FIG. 25. After masking, the conductor lines 104 (FIG. 26) are built-up within the recesses 108 by conventional plating techniques from copper and to the required depth. After removal of the masking material, the cross-sectional shape of the pin is as shown in FIG. 24.

Figure 27:
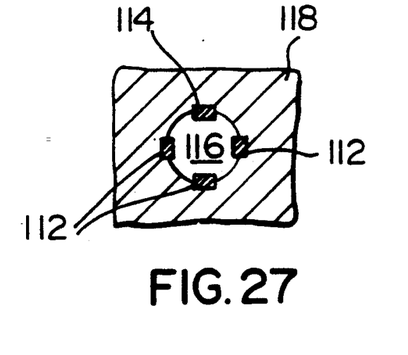
FIGS. 27 and 28 are cross-sectional views through apparatus showing two different alternative methods of producing the pin of the second embodiment.

By an alternative process, the pin 100 is formed by injection molding. As shown in FIG. 27, four square cross-sectional wires 112 to form the conductor lines 104 are located in recesses 114 in a mold cavity 116 of an injection mold 118. The four conductor wires are held rigidly in position while the body 102 of the pin is then molded into position.

Figure 28:
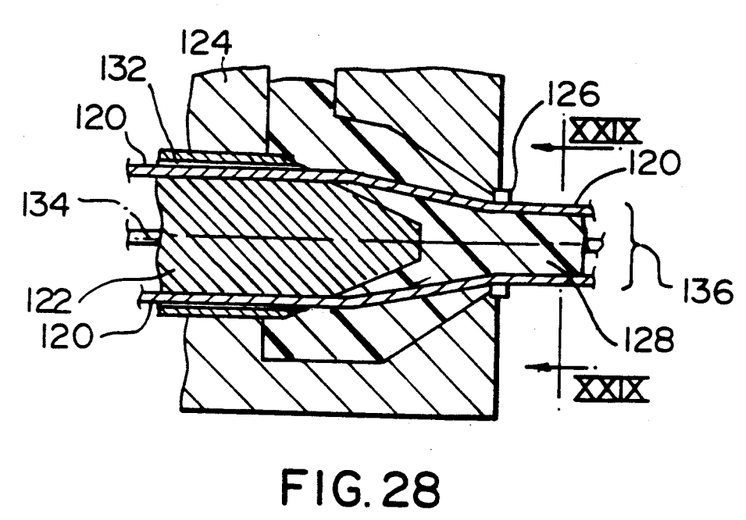
Figure 29:
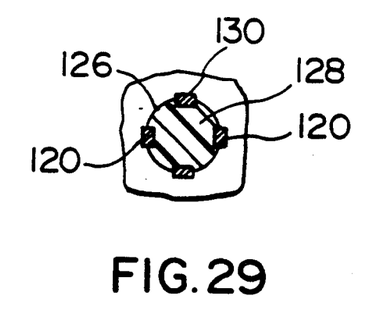
FIG. 29 is a cross-sectional view through an extruded product taken along line XXIX—XXIX in FIG. 28.

In a further alternative method, the pin 100 is formed as part of a continuous pin forming process together with a plurality of other pins by passing wires 120 of indefinite length through a core tube 122 disposed in an extruder head 124 (FIG. 28), the wires emerging from a die orifice 126 together with extrudate 128 which contacts the wires. As can be seen from a cross-sectional view in FIG. 29 of the die orifice, the wires 120 are guided in recesses 130 in the die orifice to locate them accurately in position while the plastics material is extruded around three of their sides. To assist in holding the wires continuously in their desired positions of the die orifice, guide passages 132 in the core tube 122 (FIG. 28) are disposed radially outwards further from a center line 134 of the extrusion head than the recesses 130. Thus, as the material is extruded, the wires travel slightly radially inwards in inclined fashion from the core tube to the recesses 130 so that they are held firmly against the bases of the recesses. The resultant extruded length 136 has the desired configuration and size of the individual pins 60 in cross-sectional area. At a position spaced downstream from the extruder head, the length 136 is severed to provide each of the pins. Due to the severing technique, the pins may not be formed with the tapered ends as shown in FIG. 23.

Figure 30:
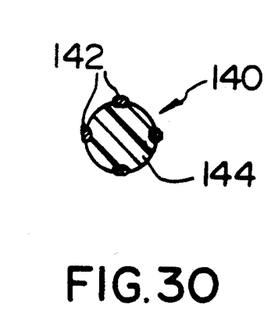
FIG. 30 is a cross-sectional view through a circuit board pin forming a modification of the second embodiment.

In a modification of the second embodiment as shown in FIG. 30, a circuit board pin 140 which is otherwise as shown in FIG. 23, is provided with conductor lines 142 which are of circular shape. These conductor lines 142 are substantially completely embedded just below the surface of a body 144 of the pin, but with part of the periphery of each of the conductor lines projecting slightly from the surface of the body.

The circuit board pin of the second embodiment is conveniently provided as part of a printed circuit board, pin and daughter board assembly 150 as shown in FIGS. 31 to 38. The total assembly includes a plurality of pins 100 in desired positions within the assembly. However, the assembly will be described with reference to one of the pins 100 only.

Figure 31:
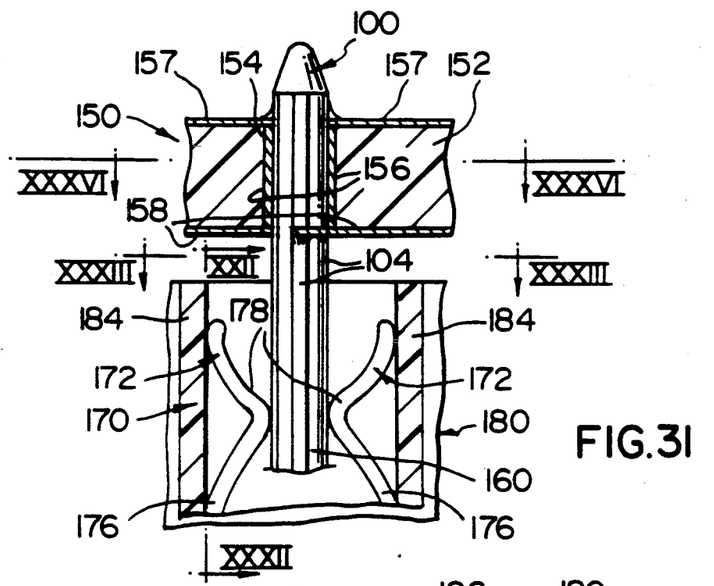
FIG. 31 is a cross-sectional view through an assembly comprising a circuit board pin of the second embodiment inserted into a printed circuit board and into a daughter printed circuit board.
Figure 32:
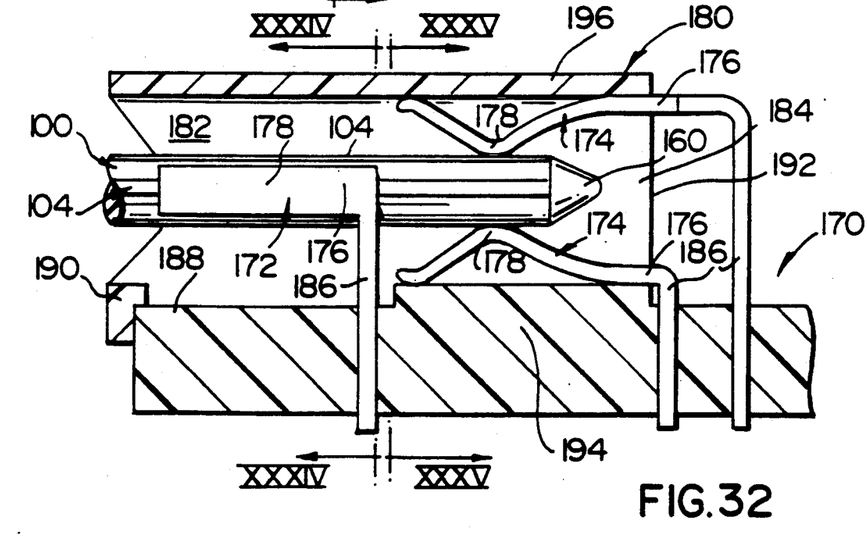
FIGS. 32 and 33 are cross-sectional views through the assembly taken, respectively, along lines XXXII—XXXII and XXXIII—XXXIII in FIG. 31.
Figure 33:
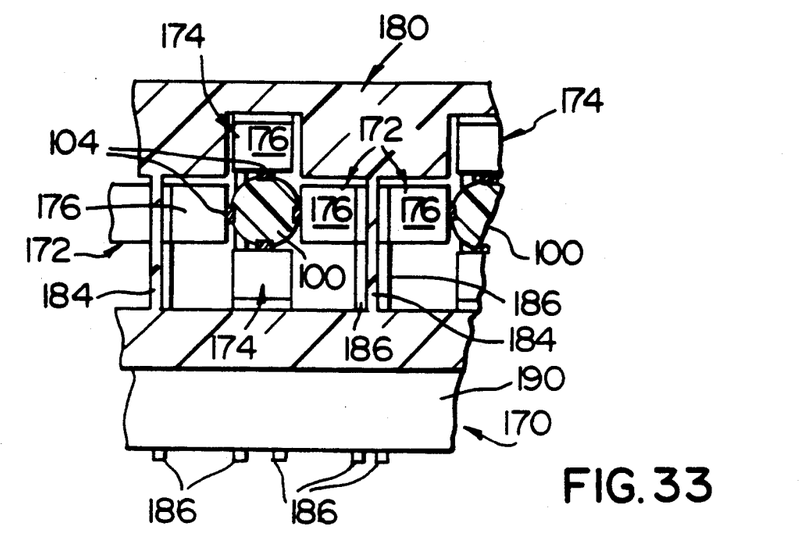
Figure 34:
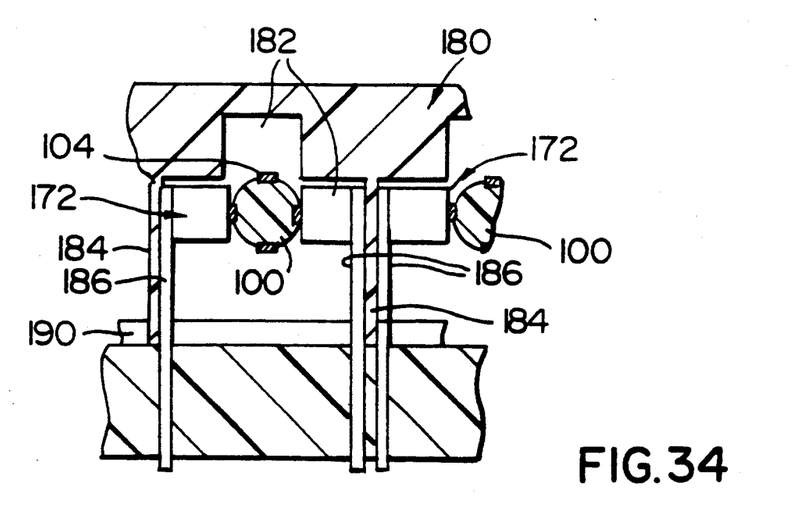
FIGS. 34 and 35 are cross-sectional views through the assembly taken, respectively, along lines XXXIV—XXXIV and XXXV—XXXV in FIG. 32.
Figure 35:
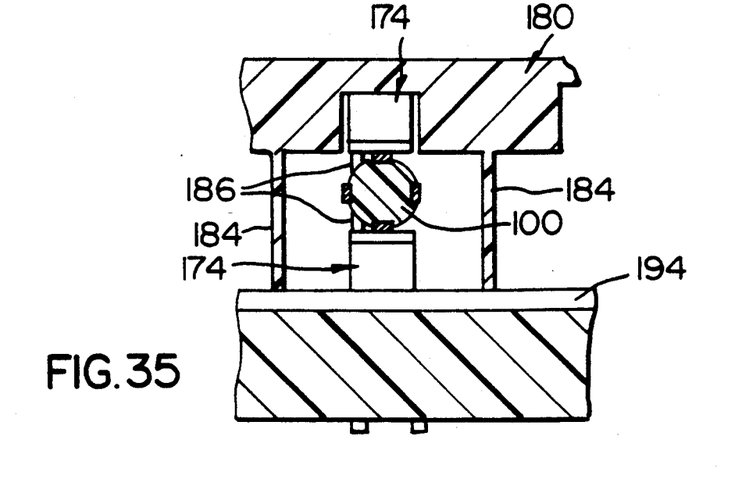

As can be seen from FIGS. 31, 32 and 33, the assembly 150 comprises a printed circuit board 152 having a plurality of pins 100 inserted through holes 154 in the board, the pins being spaced apart in a single line. The four conductor lines 104 of each pin 100 are soldered to individual conductor terminals 156 of four such terminals provided within each hole 154 (FIG. 36) which are interconnected with individual circuit lines 157 on one side of the board (FIGS. 31 and 37) and circuit lines 158 on the other side of the board. Thus, each pin 100 is connected to four different circuits of the board by passing through a single hole in the board. One end 160 of each pin 100 extends outwardly from the board to make electrical contact with the daughter printed circuit board 162.

Figure 36:
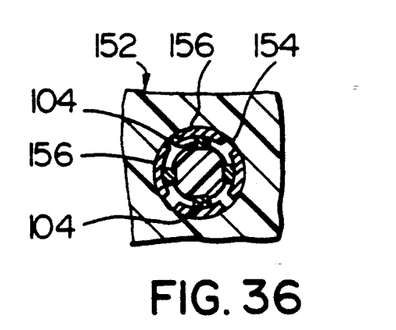
FIG. 36 is a cross-sectional view through the printed circuit board of the assembly taken along line XXXVI—XXXVI in FIG. 31.
Figure 37:
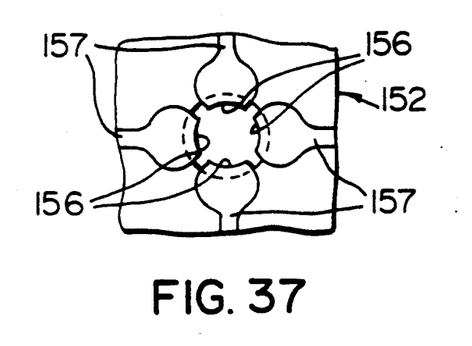
FIG. 37 is a plan view on one side of the circuit board of FIG. 36.

As shown in FIGS. 36 and 37, each conductor terminal 156 extends circumferentially of its hole 154 and is electrically isolated by being circumferentially spaced from adjacent conductor terminals 156.

Figure 38:
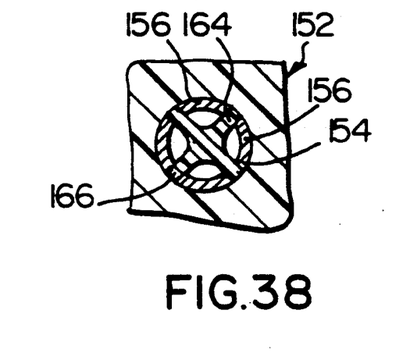
FIG. 38 is a cross-sectional view similar to FIG. 36 and showing one stage in the manufacture of the board.

While the steps in the manufacture of the board 52 may be similar to those described with reference to FIGS. 5 to 17 by using masking plugs to mask parts of each hole upon which conductor terminals are not required, clearly the plugs 164 themselves, as shown by FIG. 38, are of different shape from the plugs 44 described above. As shown by FIG. 38, each plug 164 is substantially cruciform in cross-section with arms 166 providing the masked regions of the hole surface and upon which copper material should not be deposited. FIG. 38 does not show the detail of the layers of each of the conductors 156 as is shown in FIGS. 5 to 17, but it should be understood that each conductor 156 comprises an underlying copper layer which has been electrolessly deposited, and an overlayer of electroplated copper material. This is the composition of each conductor 156 in the stage at FIG. 3 with the mask in position. Subsequently, a tin/lead layer would also be applied to cover the electroplated layer prior to removal of the plug 164 and masking material which would then be present upon the two sides of the board. Etching would then follow to remove the unwanted copper material within the holes and upon surfaces of the board substrate.

Contact of each pin 100 with the daughter circuit board 170 is provided by two pairs of terminal contacts 172 and 174 extending from the circuit board 170. As may be seen from FIGS. 31 to 35, each of the contacts 172 and 174 comprises an arcuate spring beam 176, the beams being angularly spaced apart around a common center for accommodating the projecting end 160 of the pin. Each spring beam 176 has a substantial width as can be seen from the Figures so that each beam maintains contact with the conductor lines 104 of the pin in the event that the pin is angularly displaced slightly out of its desired position within the printed circuit board 152. In order to obtain a maximum width of each spring beam 176, it may be necessary to space the pairs 172 and 174 axially of the common center (FIG. 32) with the spring beams of each pair being disposed diametrically opposite to one another across the common center as is clearly shown for instance by FIGS. 32, 33, 34 and 35. Each spring beam has inwardly arcuate contact portions 178 for contact with a corresponding conductor line 104 upon a corresponding pin 100 being inserted appropriately into a dielectric shroud 180 containing the spring beams. The spring beam 176 for each pin is housed within a suitably shaped chamber 182 in the shroud 180. Separation of the chambers 182 of adjacent pins is provided by webs 184 of the shroud 180 as shown in the figures.

The spring beams 176 of the terminal contacts 172 operate against the webs 184. The terminal contacts 172 and 174 have projections 186 extending from the spring beams 176 and which act as circuit board pins which extend through the daughter board 170 and make contact with circuitry forming part of the daughter board. The shroud 180 is positioned over the terminal contacts 172 and 174 after manufacture of the daughter board, one side of the shroud being omitted to provide an opening 188 which extends from a location shoulder 190 at one side of the shroud to a remote end 192 of the shroud as shown by FIG. 32. Because of this omission of one of the sides of the shroud, the spring beam 176 of one of the terminal contacts 174 is supported for operation by a raised surface part 194 of the daughter board while the spring beam 176 of the other terminal contact 174 operates against a wall 196 of the shroud 180.

Figure 39:
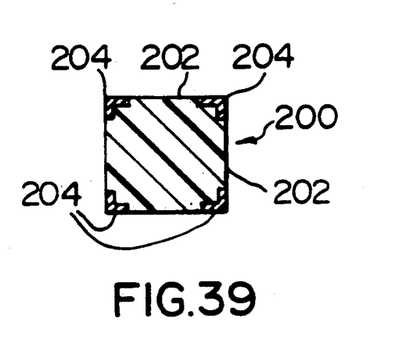
FIG. 39 is a cross-sectional view through a circuit board pin according to a third embodiment.

FIG. 39 illustrates a circuit board pin 200 according to a third embodiment. As is shown by FIG. 39, the circuit board pin 200 is of square or rectangular section and has longitudinally flat sides 202. The junction regions between the sides 202 are recessed to accommodate conductor lines 204 which extend longitudinally of the pin. These conductor lines are substantially L-shaped with two legs of each line lying in a recess of the plane of the adjacent side 202. The pin 200 is conveniently formed by plating techniques similar to that described with reference to FIGS. 24 to 26 in relation to the second embodiment.

It is intended that holes in a printed circuit board for accepting pins of the structure of the pin 200 should each have four conductor terminals. Each of the holes with its four conductor terminals which are electrically isolated from one another, is formed as follows.

Figure 40:
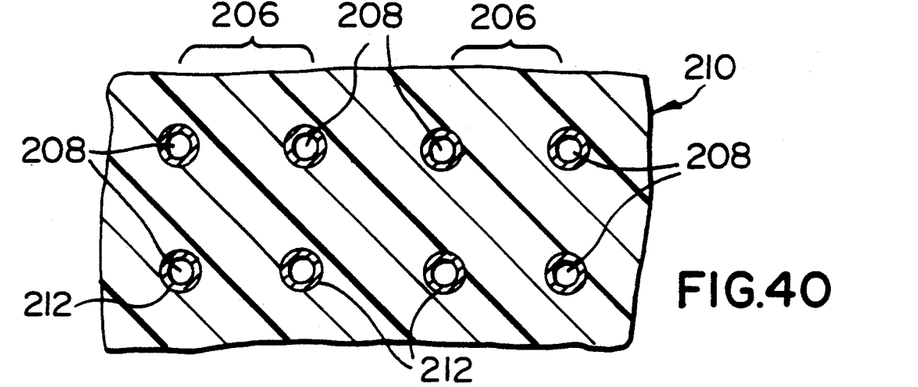
FIG. 40 is a cross-sectional view through a printed circuit board at one stage of its manufacture and for acceptance of pins according to the third embodiment.
Figure 41:
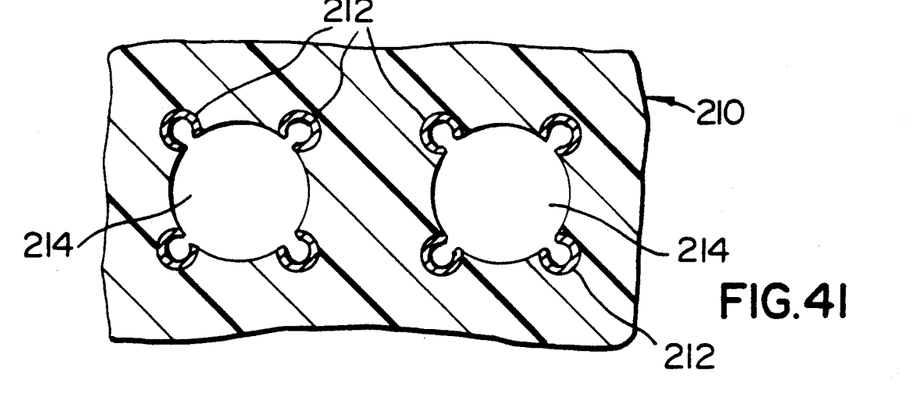
FIG. 41 is a view similar to FIG. 40 of the board after completion.

With regard to FIG. 40, for each of the holes in a printed circuit board to be formed for acceptance of a pin 200, a group 206 of four holes 208 is provided in the circuit board 210. The holes 208 of each group 206 are positioned at the corners of a square lying on the circumference of the pin receiving hole to be formed. The holes 208 of all of the groups 206 are then formed with a continuous layer of conductive material 212 (FIG. 40) in the normal manner for forming conductive layers upon the surfaces of holes of printed circuit board. Subsequently, as shown by FIG. 41, each of the holes 214 for acceptance of a pin 200 is formed in its precisely required location and each hole 214 cuts through each of the holes 208 of a respective group 206 and through the conductive layers 212. Each of the conductive layers 212 is thus formed into the shape of an arc as a conductor terminal as shown in FIG. 41 with cut ends of the terminals exposed at the perimeter of the hole 214.

Figure 42:
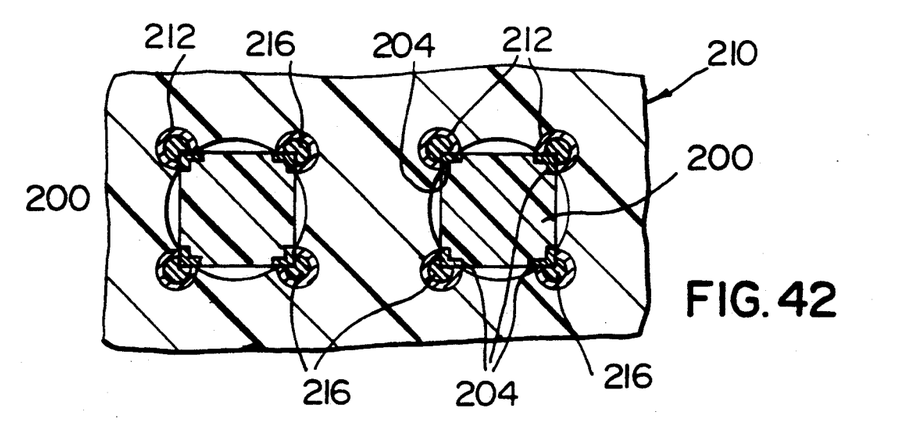
FIG. 42 is a view similar to FIG. 41 and showing a pin of the third embodiment mounted into the board.

A pin 200 is then inserted into each of the holes 214 with the pin correctly oriented so that the L-shaped conductor lines 204 contact the exposed cut edges of the terminals 212, one conductor line 204 to each terminal. Each pin is then disposed in the position shown in FIG. 42. Gaps which are defined between surfaces of the conductor lines 204 and the surfaces of the conductor terminals 212 are then filled with solder 216 by conventional soldering operations. The solder provides acceptable electrical continuity between the conductor lines 204 and the conductor terminals 212. As discussed above in a previous embodiment, with the soldering operation, the solder is not caused to flow around the pin so that there is no electrical bridging between one terminal 212 and the next.

As may be seen from the above embodiments, the invention is concerned with the use of more than one conductor line on a printed circuit board pin which, in use, provides certain advantages as discussed above. In the embodiments, the pins are shown as having either two or four conductor lines. However, subject to manufacturing restrictions, pins may be constructed having other numbers of conductor lines. For instance, a triangular section pin may have three conductor lines at the apices of its triangular section for connection with three conductor terminal layers inside a printed circuit board. It is also possible to have pins with more than four conductor lines subject to the practicalities of commercial manufacture.

What is claimed is:

1. A printed circuit board and circuit board pin assembly comprising a plurality of circuit board pins each of which comprises a dielectric body carrying a plurality of electrical conductor lines which are electrically isolated from one another and extend longitudinally of the pin, each pin mounted within a pin receiving hole of the printed circuit board with at least one end of the pin extending from the board, and the board having in each hole, a plurality of circumferentially spaced apart and mutually electrically isolated conductor terminals which extend longitudinally of the hole, the conductor terminals in each hole being electrically connected one to each of the conductor lines on the pin and one to each of a plurality of mutually electrically isolated circuit lines carried by a substrate of the board.

2. An assembly according to claim 1 wherein each conductor terminal is soldered to its corresponding electrical conductor line of the pin.

3. An assembly according to claim 1 wherein each circuit board pin has at least two electrical conductor lines exposed at the surface of the dielectric body and spaced laterally of one another around the surface, the assembly also having a daughter circuit board, and for each pin, the daughter circuit board having circuit lines with terminal contacts extending from a surface of the daughter circuit board, the terminal contacts spaced apart around a common center for accommodating the end of the pin extending from the circuit board with the contacts having contact springs resiliently movable outwardly from the center for resiliently engaging the conductor lines of the pin when the pin is inserted between the contacts, one contact spring to each conductor line.

4. A method of providing an assembly of a printed circuit board and a plurality of circuit board pins comprising:
   providing a circuit board pin comprising a dielectric body carrying a plurality of electrical conductor lines which extend longitudinally of the pin, the conductor lines being electrically isolated from each other;
   providing a printed circuit board formed with a plurality of holes and comprising a plurality of conductor terminals circumferentially spaced apart and mutually electrically isolated within each hole, each terminal electrically connected to an individual circuit line carried by a substrate of the board;
   and inserting each pin into a respective hole and electrically connecting each conductor line of the pin solely with a respective conductor terminal within said respective hole.

5. A method according to claim 4 wherein the conductor terminals of the board are provided by spaced apart conductive layers each extending partly around the surface of the hole, the method comprising inserting the pin into the hole and soldering each conductor line of the pin to a respective conductive layer.

* * * * *